United States Patent [19]

Nariani

[11] Patent Number: 5,470,775
[45] Date of Patent: Nov. 28, 1995

[54] METHOD OF FORMING A POLYSILICON-ON-SILICIDE CAPACITOR

[75] Inventor: Subhash R. Nariani, San Jose, Calif.

[73] Assignee: VLSI Technology, Inc., San Jose, Calif.

[21] Appl. No.: 149,085

[22] Filed: Nov. 9, 1993

[51] Int. Cl.$^6$ .............................. H01L 27/00; H01L 21/70
[52] U.S. Cl. .............................. 437/52; 437/60; 437/919; 437/200
[58] Field of Search .............................. 437/52, 60, 919, 437/200; 919/200; 148/DIG. 14

[56] References Cited

U.S. PATENT DOCUMENTS

| | | | |
|---|---|---|---|
| 4,922,312 | 5/1990 | Coleman et al. | 257/297 |
| 4,975,753 | 12/1990 | Ema | 257/296 |
| 5,017,982 | 5/1991 | Kobayashi | 257/306 |
| 5,126,279 | 6/1992 | Roberts | 437/52 |
| 5,132,756 | 7/1992 | Matsuda | 257/408 |
| 5,173,437 | 12/1992 | Chi | 437/52 |
| 5,218,511 | 6/1993 | Nariani | 361/313 |
| 5,244,825 | 9/1993 | Coleman et al. | 437/52 |
| 5,338,701 | 8/1994 | Hsu et al. | 437/60 |

FOREIGN PATENT DOCUMENTS

| | | |
|---|---|---|
| 0252679 | 1/1988 | European Pat. Off. |
| 0416707A1 | 3/1991 | European Pat. Off. |
| 63096951 | 4/1933 | Japan |
| 1-128460 | 5/1989 | Japan |
| 4217360 | 8/1992 | Japan |

OTHER PUBLICATIONS

Wolf, Silicon Processing for VLSI Era. vol. 2 pp. 189–193, 577–583, 1990.

C. Kaya H. Tigelaar, J. Paterson, M. de Wit, J. Fattaruso, D. Hester, S. Kiriakai, K. Tan, F. Tsay, "Polycide/Metal Capacitors for High Precision A/D Converters", IEDM, 1988, pp. 782–785.

T. Ono, T. Mori, T. Ajioka, T. Takayashiki, "Studies of Thin Poly Si Oxides for E and E$^2$PROM", IEDM, 1985, pp. 380–383.

T. Iida, M. Nakahara, S. Gotoh and H. Akiba, "Precise Capacitor Structure Suitable for Submicron Mixed Analog/Digital ASICs", Custom Integrated Circuits Conference, 1990, pp. 18.5.1–18.5.4.

Jim Paterson, "Adding Analog, EPROM and EEPROM modules to CMOS Logic Technology: How Modular?", IEDM, 1989, pp. 16.1.1–16.1.3.

Primary Examiner—Olik Chaudhuri
Assistant Examiner—H. Jey Tsai
Attorney, Agent, or Firm—Douglas L. Weller

[57] ABSTRACT

A method produces a capacitor. On a substrate, a first polysilicon layer is formed over an insulating region. A metal-silicide layer is formed on top of the first polysilicon layer. A dielectric layer is formed on top of the metal-silicide layer. A second polysilicon layer is formed on top of the dielectric layer. The second polysilicon layer and the dielectric layer are etched to form a top electrode and dielectric region. The metal-silicide layer and the first polysilicon layer are etched to form a bottom electrode.

16 Claims, 7 Drawing Sheets

METHOD OF FORMING A POLYSILICON-ON-SILICIDE CAPACITOR

BACKGROUND

The present invention concerns the fabrication of a capacitor for use in very large scale integrated (VLSI) circuits.

Various capacitor structures have been investigated for use in VLSI circuits. For example, see the various capacitor structures suggested by C. Kaya, H. Tigelaar, J. Paterson, M. de Wit, J. Fattaruso, D. Hester, S. Kiriakai, K. Tan, F. Tsay, *Polycide/Metal Capacitors for High Precision A/D Converters*, IEDM, 1988, pp. 782–785.

The voltage linearity of a capacitor is the change in normalized capacitance of the capacitor per unit change in the voltage across the capacitor. A smaller linearity implies a more stable capacitance, which is desirable. In poly-to-poly capacitors, increasing doping concentration of the polysilicon electrodes of a capacitor reduces the voltage linearity of the capacitor. However, as the circuit density of VLSI circuits increases, high doping of polysilicon can result in an increased potential for a leakage current through the oxide. See, for example, T. Ono, T. Mori, T. Ajioka, T. Takayashiki, *Studies of Thin Poly Si Oxides for E and $E^2PROM$*, IEDM, 1985, pp. 380–383, and T. Iida, M. Nakahara, S. Gotoh and H. Akiba, *Precise Capacitor Structure Suitable for Submicron Mixed Analog/Digital ASICs*, Custom Integrated Circuits Conference, 1990, pp. 18.5.1–18.5.4. Additionally, the fabrication of poly-to-poly capacitors generally requires high temperature doping and oxidation steps, which can adversely affect reliability and performance of the integrated circuit components. Also, the metal-to-poly capacitor and the metal-to-polycide require additional processing steps which add to the complexity of the circuit and in many cases adversely affect reliability, or compromise performance. For poly-to-poly capacitors in which the top electrode is polycide, the capacitor has poor characteristics which require additional processing. The additional processing can be cost prohibitive.

SUMMARY OF THE INVENTION

In accordance with the preferred embodiment of the present invention, a method is presented for producing a capacitor during the course of integrated circuit fabrication. On a substrate, a first polysilicon layer is formed over an insulating region. A metal-silicide layer is formed on top of the first polysilicon layer. A dielectric layer is formed on top of the metal-silicide layer. A second polysilicon layer is formed on top of the dielectric layer. The second polysilicon layer and the dielectric layer are etched to form a top electrode and dielectric region. The metal-silicide layer and the first polysilicon layer are etched to form a bottom electrode.

In the preferred embodiment of the present invention, the metal-silicide layer is composed of Tungsten-silicide. The dielectric layer is, for example, a deposited silicon oxide using TEOS as the source of the silicon (also referred to as TEOS oxide). Also, as an alternative to using an oxide dielectric, a sandwich of oxide, nitride and oxide sub-layers may be used. The metal-silicide layer is etched so that the bottom electrode has a greater area than the top electrode. The first polysilicon layer and the metal-silicide layer are also used to form gates for transistors on the integrated circuit. The second polysilicon layer may also be used to form resistors for the circuit.

The present invention has several advantages over the prior art processes. For example, the present invention provides for a method which is simple, practical and fully compatible with current VLSI processes. Integrating the capacitor of the present invention into a polycide-gate integrated circuit process does not perturb the characteristics of the integrated circuit components. Moreover, the resulting capacitor has superior linearity and low current leakage. The superior linearity results from the high conductivity of the capacitor electrodes. The layer used for the top plate of the capacitor has sufficient sheet resistivity (generally greater than 30 ohms per square) so that the layer may be used to form resistors. Further, the steps which are additional to conventional processing may be performed at relatively low processing temperatures, preserving reliability and performance of the VLSI circuitry.

DESCRIPTION OF THE PREFERRED EMBODIMENT

The present invention provides a method for fabricating a capacitor which is simple, practical and fully compatible with current VLSI processes. In the discussion below, conventional implant steps, such as implants for threshold voltage and substrate doping adjustments, or implants to form source/drain regions and isolation regions, are omitted as they are not germane to the formation of capacitors according to the preferred embodiment of the present invention.

Figure 1:
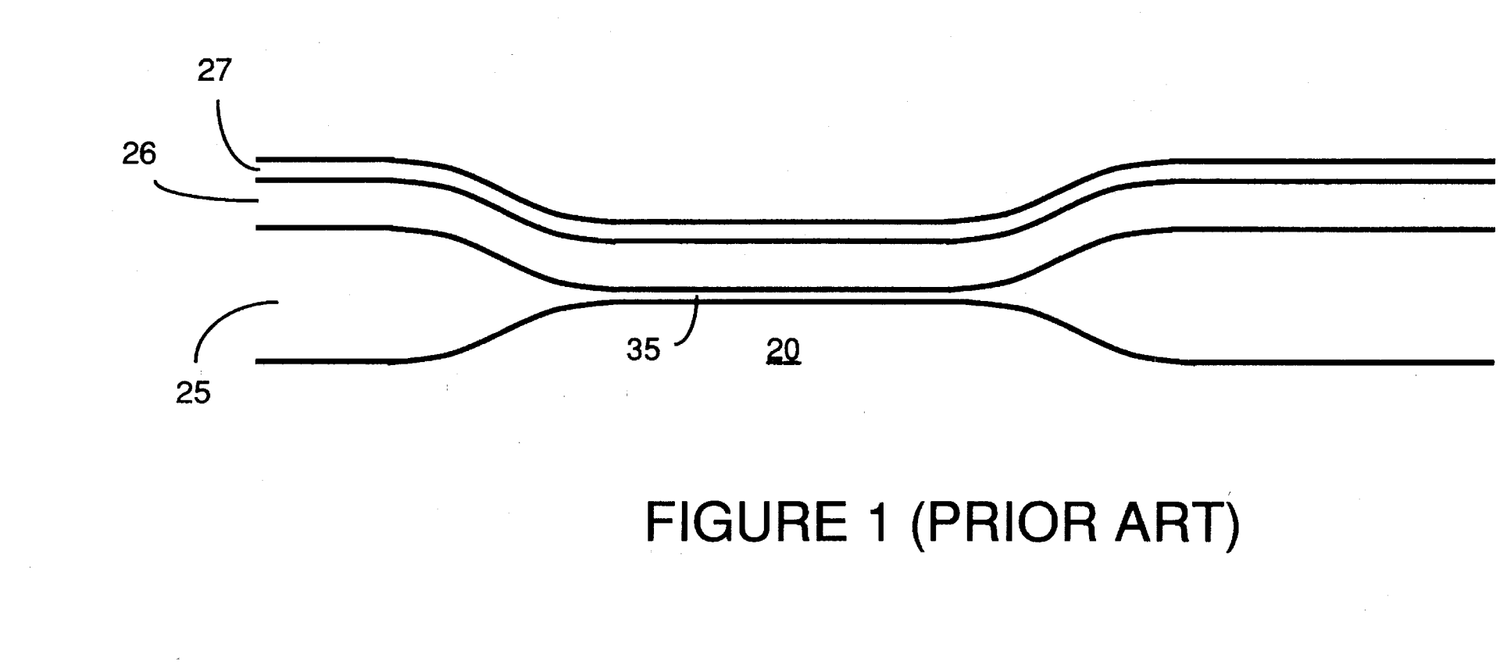
FIGS. 1, 2, 3 and 4 illustrate a method for producing a capacitor for use in integrated circuits in accordance with the preferred embodiment of the present invention.

FIG. 1 shows the result of conventional semiconductor processing. On a substrate 20, a local oxidation of silicon (LOCOS) process or other process is used to form an insulating layer 25 of, for example, field oxide on the substrate as shown. For example, in a LOCOS process, a layer of pad oxide is formed. On top of the pad oxide, a layer of nitride is formed. The nitride is patterned and etched. Field oxide is grown on the substrate at places where the nitride has been etched to expose the substrate. The nitride and pad oxide are then removed.

After insulating layer 25 is formed, a layer of gate oxide 35 is placed (i.e. grown or deposited) on exposed portions of the substrate. A layer of polysilicon 26 is deposited over the layer of gate oxide 35 and insulating layer 25. For example, the deposition may be a chemical vapor deposition (CVD). The polysilicon is doped, for example, with n-type atoms at approximately $10^{20}$ atoms per cubic centimeter. The doping may be performed using $POCl_3$. Alternately, an implant of Phosphorus or Arsenic atoms may be used. Alternately, an in situ doped polysilicon may be deposited. A metalsilicide layer 27 is formed on top of polysilicon layer 26, for example by chemical vapor deposition at approximately 400 degrees Centigrade or by sputtering at approximately 200 degrees Centigrade. For example, the metal-silicide may be Tungsten-silicide. The metal used for metal-silicide layer 27 may alternately consist of, for example, Titanium (Ti) Molybdenum (Mo), Chromium (Cr), Nickel (Ni), Cobalt (Co), or Tantalum (Ta).

Figure 2:
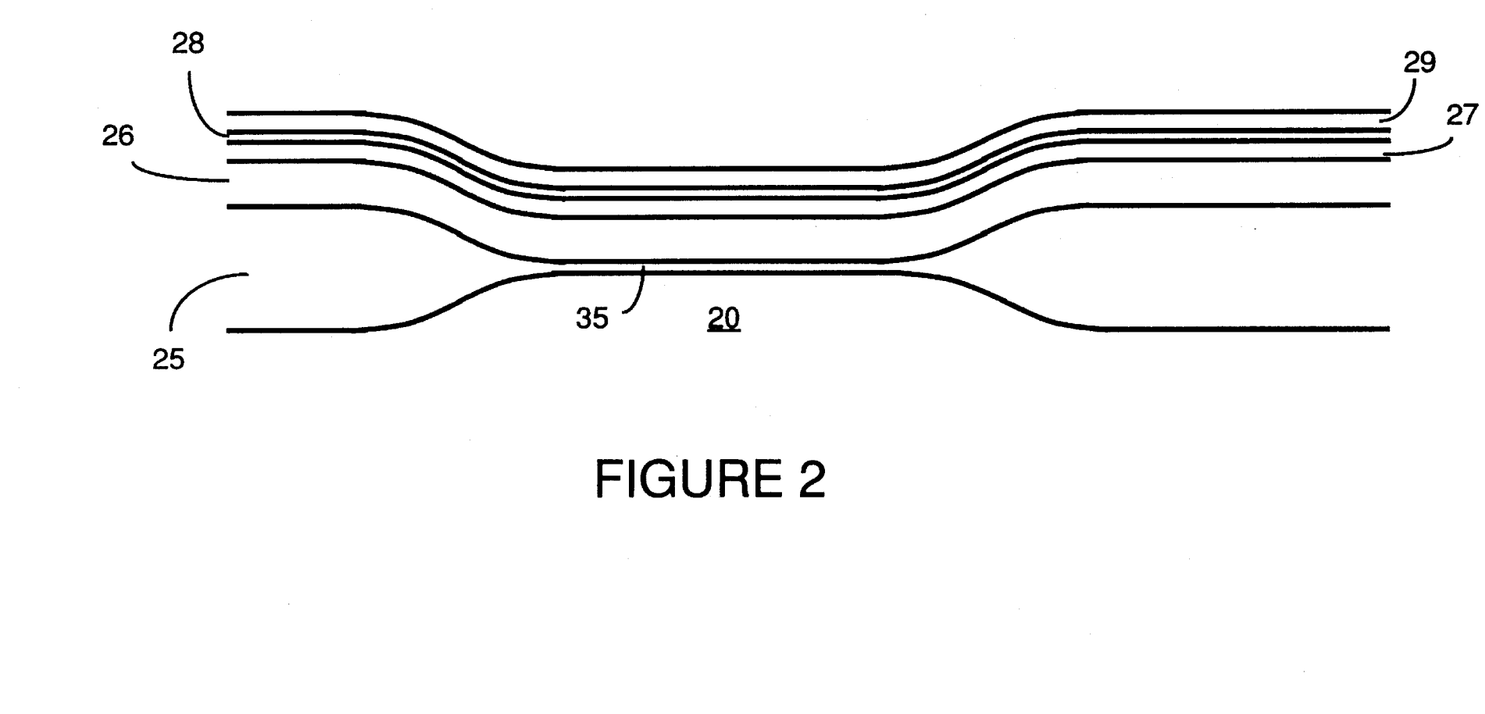
Figure 3:
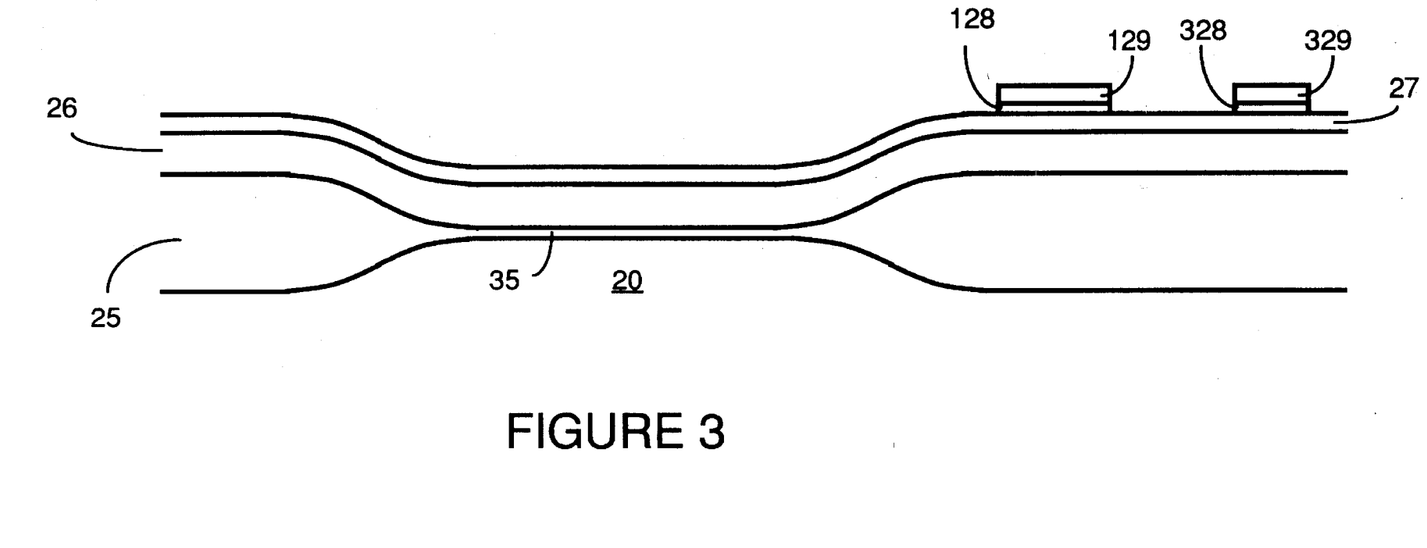

FIG. 2 and FIG. 3 illustrate additional processing steps which, when added to conventional processing, allow for the formation of a polysilicon on silicide capacitor. As illustrated by FIG. 2, a dielectric layer 28 is formed on top of metal-silicide layer region. Dielectric layer 28 may be, for example, a deposited silicon oxide using TEOS as the source of the silicon (also referred to as TEOS oxide). When deposited, the TEOS oxide is approximately 0.1 microns thick. Alternate sources of silicon for the deposited oxide are silane, dichlorosilane or other organic silicon sources. Alternative to the use of deposited oxide, thermally grown oxide may be used. Also, as an alternative to using an oxide dielectric, a sandwich of oxide, nitride and oxide sub-layers may be used for dielectric layer 28. As is understood in the art, the formation of the oxide, nitride and oxide sublayers may be achieved using processing operating at temperatures below 850 degrees Centigrade.

Up to this point, the process is similar to that disclosed in U.S. Pat. No. 5,218,511 issued to Subhash R. Nariani on Jun. 8, 1993 for *INTERSILICIDE CAPACITOR*. The capacitor resulting from the process shown therein used metal-silicide for a top capacitor plate. The resulting capacitor voltage coefficient of such a capacitor is in the range of 30 to 50 ppm/volt. However, the metal-silicide material used for the top capacitor plate has a low sheet resistance (approximately 5 ohms per square). Therefore, any resistors constructed using this layer would need to be too large to be cost effective.

The present invention alters and improves the technology disclosed in U.S. Pat. No. 5,218,511. Particularly, in the preferred embodiment of the present invention, a polysilicon layer 29 is formed on top of dielectric layer 28, for example by chemical vapor deposition (CVD). The polysilicon is doped, for example, with n-type atoms at approximately $5 \times 10^{20}$ atoms per cubic centimeter. The doping may be performed using $POCl_3$. Alternately, an implant of Phosphorus or Arsenic atoms may be used. Alternately in situ doped polysilicon may be used. When formed, polysilicon layer 29 is, for example, 0.20 microns thick. The doped polysilicon layer 29 is used both for the top plate of a capacitor and for the construction of resistors. In the preferred embodiment of the present invention, sheet resistance for doped polysilicon layer 29 is typically greater than 30 ohms per square.

As illustrated by FIG. 3, a conventional mask and etch process is used to form a top electrode 129 and a dielectric region 128. As is understood in the art, dimensions for top electrode 129 and dielectric region 128 can vary significantly depending, for example, on the size of the capacitor required by the integrated circuit design. This etch is also used to shape resistors which are formed from polysilicon layer 29. For example, FIG. 3 shows a resistor 329 over dielectric region 328.

Once the etch is complete, the resist mask is removed. The depth of the etch of polysilicon layer 29 and dielectric layer 28 to form top electrode 129 and dielectric region 128 is controlled so that the etch stops at metal-silicide layer 27.

Figure 4:
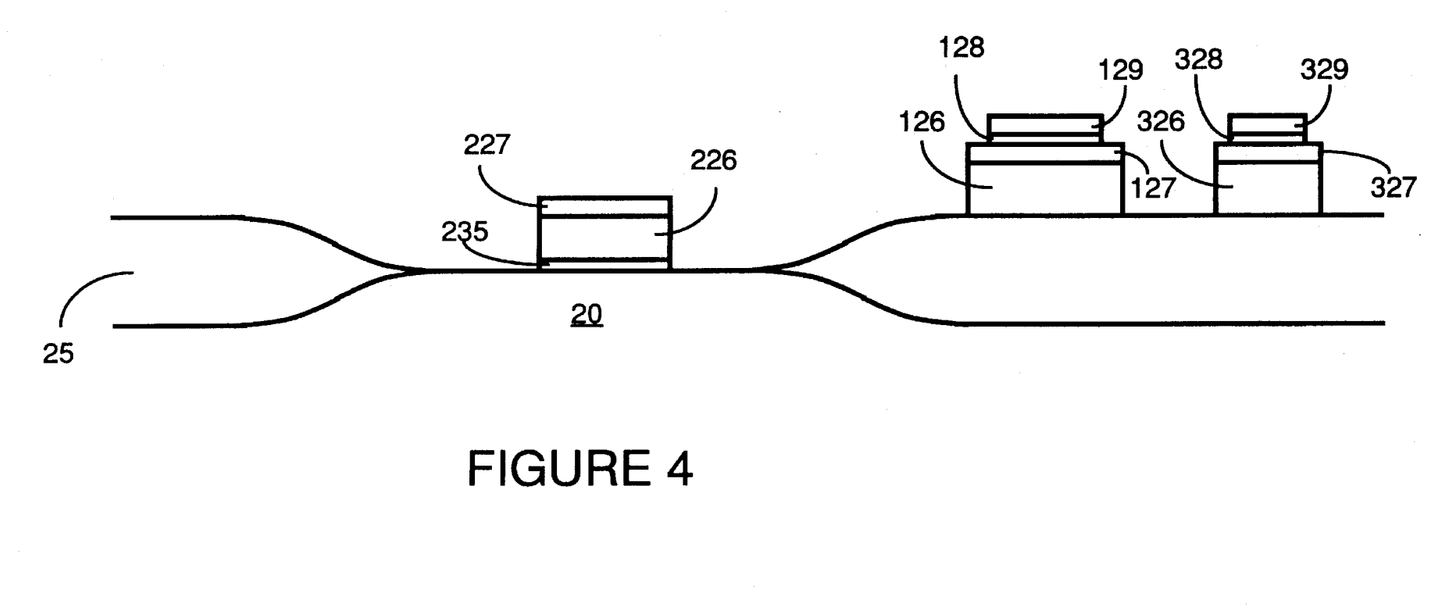

As illustrated by FIG. 4, conventional processing steps are resumed. A conventional mask and etch process is used to form a conventional gate consisting of a dielectric region 235, polysilicon region 226 and metal-silicide region 227. During this mask and etch, a bottom electrode for the capacitor is formed. The bottom electrode consists of a metal-silicide region 127 on top of a polysilicon region 126. In the preferred embodiment of the present invention, the resulting capacitor generally has a voltage coefficient of less than 20 ppm per volt.

Additionally, metal-silicide region 327 and polysilicon region 326 serve as a base for resistor 329. Metal-silicide region 327 and polysilicon region 326 are electrically isolated from other circuitry.

In the preferred embodiment of the present invention, as described above, the dielectric layer 28 is etched with polysilicon layer 29 to form dielectric region 128. In alternate embodiments of the present invention, dielectric layer 28 may be etched alone to form dielectric region 128 or may be etched with metal-silicide layer 27. When dielectric layer 28 is etched with metal silicide layer 26, the dimensions of dielectric region 128 will match metal-silicide region 127 rather than polysilicon region 129.

Further processing is conventional. For example, an insulating layer of a BPSG layer on top of a deposited silicon oxide layer are deposited over the wafer. For example, the deposited silicon oxide layer is 0.15 microns and the BPSG layer is 0.4 microns. The insulating layer is masked and etched to produce connection holes. A metal layer is then deposited. The metal layer, through the connection holes, is electrically connected to metal-silicide region 127, polysilicon region 129, metal-silicide region 227 and resistor 329.

The present invention has several advantages over the prior art processes. For example, the present invention provides for a method which is simple, practical and fully compatible with current VLSI processes using polycide transistor gates. The performance characteristics of the integrated circuit components are unperturbed. The resulting capacitor has superior linearity and low current leakage. Further, the additional steps which are additional to conventional processing may be performed at relatively low processing temperatures (e.g., less than 850 degrees Centigrade), preserving reliability of the VLSI circuitry.

Figure 5:
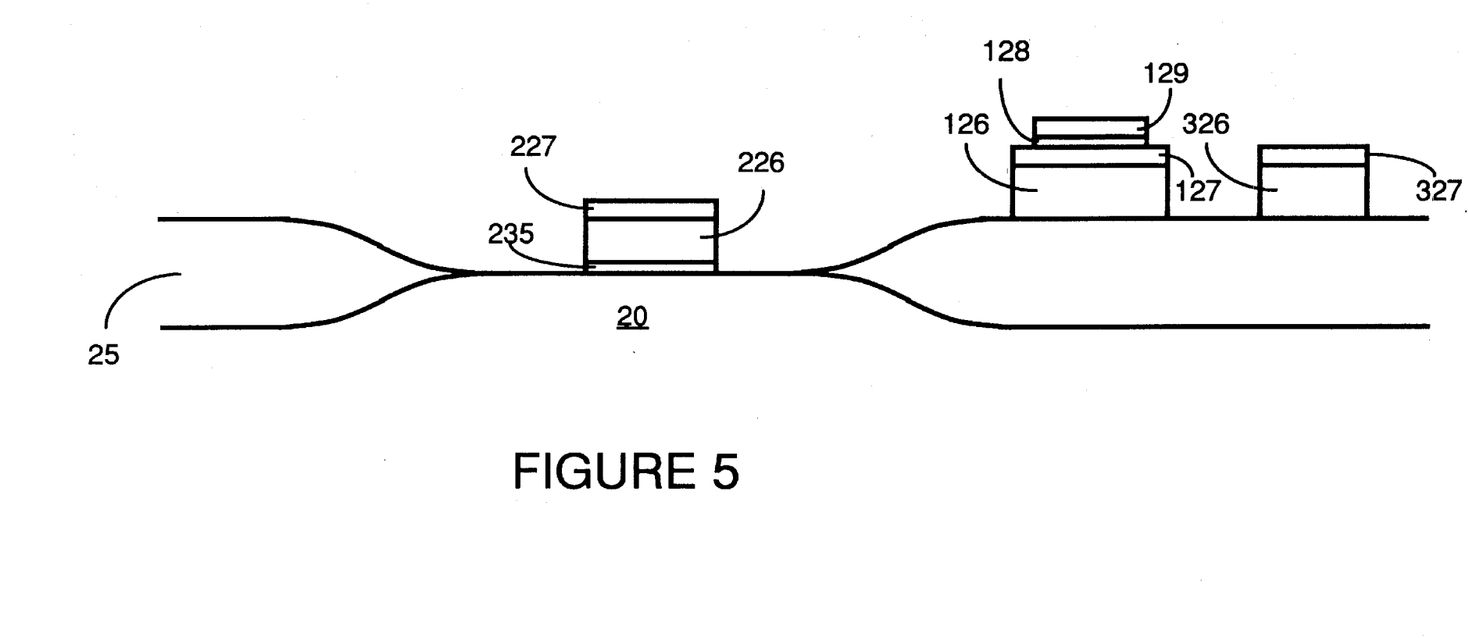
FIGS. 5, 6 and 7 each show a capacitor for use in integrated circuits in accordance with alternate embodiments of the present invention.

Alternate to, or in addition to, resistors being formed using polysilicon layer 29, resistors may also be formed using metal-silicide layer 27 and polysilicon layer 26. This is illustrated by FIG. 5 where region 326 and region 327 are used together as a resistor and dielectric region 328 and resistor 329, shown in FIG. 4, are omitted.

Figure 6:
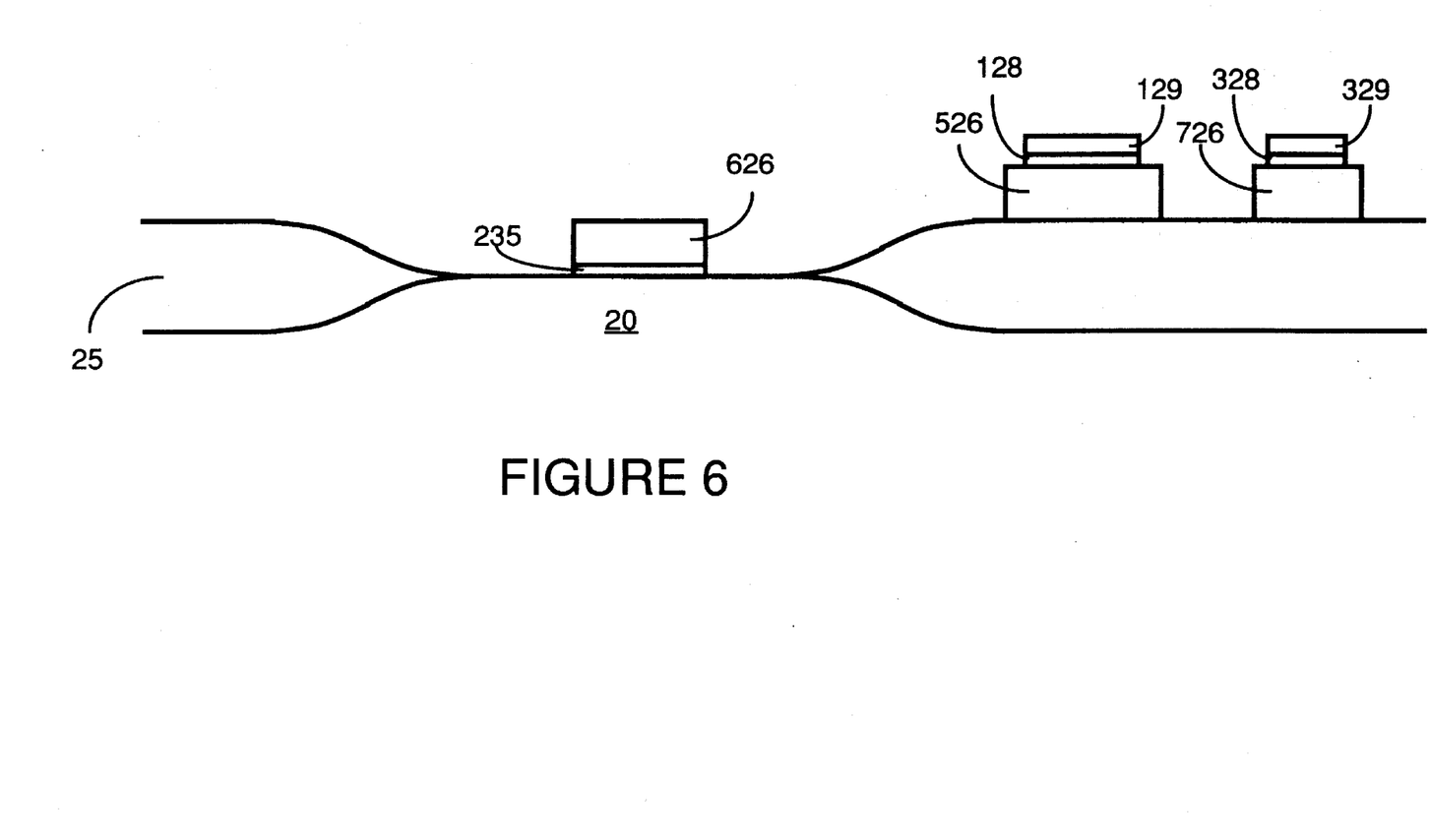

Additionally, the present invention may be utilized when the gate is formed of doped polysilicon. In this case, the formation of metal-silicide layer 27 is omitted. Polysilicon layer 26 is doped, for example, with n-type atoms at approximately $5 \times 10^{20}$ atoms per cubic centimeter. The doping may be performed using $POCl_3$. Alternately, an implant of Phosphorus or Arsenic atoms may be used. The resulting structure is shown in FIG. 6. There, a conventional polysilicon gate structure is shown to consist of a doped polysilicon region 626 placed over dielectric region 235. The bottom electrode for the capacitor consists of a doped polysilicon region 526. The structure of the resistor, region 329, is formed over polysilicon region 726.

Figure 7:
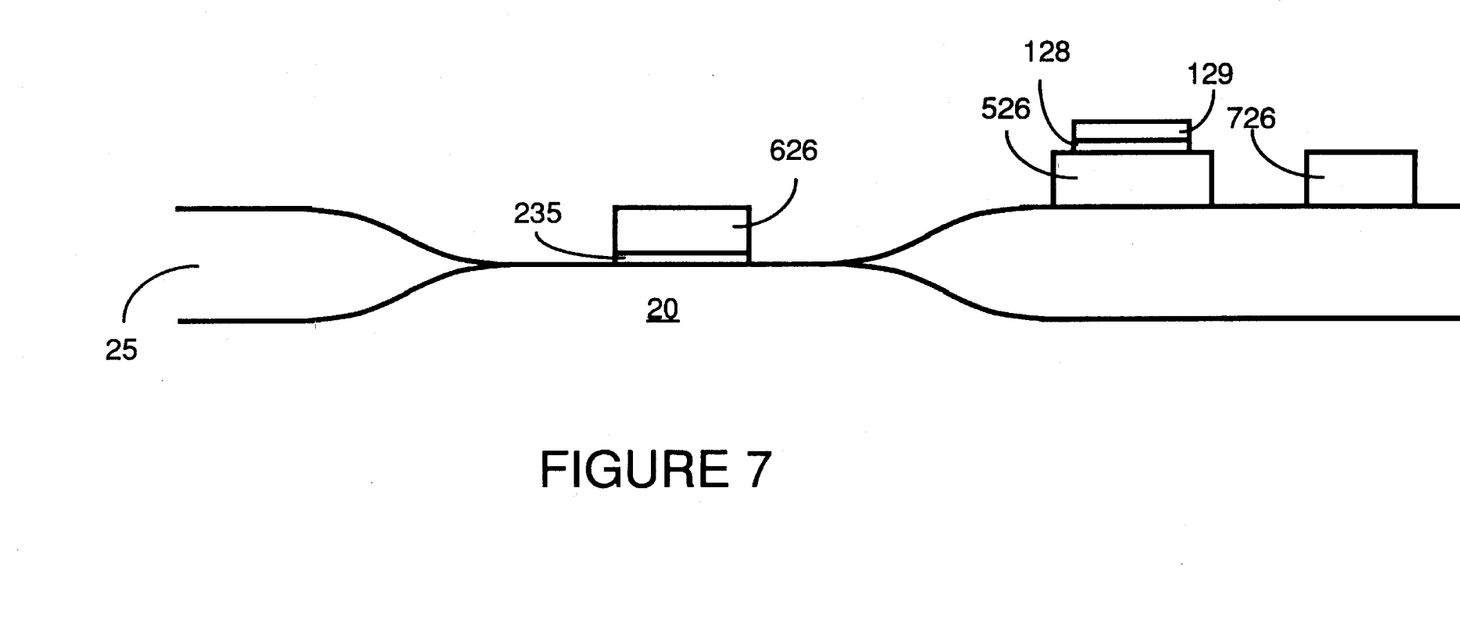

In the embodiment shown in FIG. 6, region 726 may also be used to form a resistance. When the thickness of polysilicon layer 26 is selected to match the thickness of polysilicon thickness layer 29, then matched resistors may be formed in region 329 and region 726. This is a simple way to produce matched resistors while taking up minimum circuit surface area. Also, resistors may be formed only in the first polysilicon layer, e.g., region 726 may be used to form a resistor. In this case, it is not necessary to form regions 328 and 329. See, for example, the structure in FIG. 7.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for producing a capacitor comprising the steps of:
   (a) forming a first polysilicon layer over an insulating region on a substrate;
   (b) forming a metal-silicide layer on top of the first polysilicon layer;
   (c) forming a dielectric layer on top of the metal-silicide layer;
   (d) forming a second polysilicon layer on top of the dielectric layer;
   (e) etching the second polysilicon layer to form a top electrode; and,
   (f) after step (e) etching the metal-silicide layer and the first polysilicon layer to form a bottom electrode.

2. A method as in claim 1 wherein step (f) includes etching the metal-silicide layer and the first polysilicon layer to form a gate of a transistor.

3. A method as in claim 1 wherein in step (b) the metal-silicide layer is composed of Tungsten-silicide.

4. A method as in claim 1 wherein step (e) includes etching the dielectric layer to form a dielectric region.

5. A method as in claim 1 wherein step (f) includes etching the dielectric layer to form a dielectric region.

6. A method as in claim 1 additionally comprising the following step performed after step (e) and before step (f):
   etching the dielectric layer to form a dielectric region.

7. A method as in claim 1 wherein the etching in step (e) additionally forms a resistor on top of a dielectric region.

8. A method as in claim 1 wherein the etching in step (f) additionally forms a resistor.

9. A method for producing a capacitor comprising the steps of:
   (a) forming a conductive layer over an insulating region on a substrate, including forming a doped polysilicon sub-layer and on top of the doped polysilicon sub-layer, forming a metal-silicide sub-layer;
   (b) forming a dielectric layer on top of the conductive layer;
   (c) forming a polysilicon layer on top of the dielectric layer;
   (d) etching the polysilicon layer to form a top electrode; and,
   (e) after step (d) etching the conductive layer to form a bottom electrode.

10. A method as in claim 9 wherein step (e) includes etching the conductive layer to form a gate of a transistor.

11. A method as in claim 9 wherein in step (a) the metal-silicide sub-layer is composed of Tungsten-silicide.

12. A method as in claim 9 wherein step (d) includes etching the polysilicon layer to form a resistor.

13. A method as in claim 9 wherein step (e) includes etching the conductive layer to form a resistor.

14. A method as in claim 9 wherein step (d) includes etching the dielectric layer to form a dielectric region.

15. A method as in claim 9 wherein step (e) includes etching the dielectric layer to form a dielectric region.

16. A method as in claim 9 additionally comprising the following step performed after step (d) and before step (e):
    etching the dielectric layer to form a dielectric region.

* * * * *